(12) United States Patent
Cai et al.

(10) Patent No.: US 8,917,547 B2
(45) Date of Patent: *Dec. 23, 2014

(54) COMPLEMENTARY SOI LATERAL BIPOLAR FOR SRAM IN A CMOS PLATFORM

(71) Applicant: International Business Machines Corporation, Armonk, NY (US)

(72) Inventors: Jin Cai, Cortlandt Manor, NY (US);
Leland Chang, New York, NY (US);
Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/954,206

(22) Filed: Jul. 30, 2013

(65) Prior Publication Data

US 2014/0154845 A1    Jun. 5, 2014

Related U.S. Application Data

(63) Continuation of application No. 13/691,823, filed on Dec. 2, 2012.

(51) Int. Cl.
*G11C 11/34*  (2006.01)
*H01L 21/8232*  (2006.01)
*G11C 11/40*  (2006.01)
*H01L 27/12*  (2006.01)

(52) U.S. Cl.
CPC ............. *G11C 11/40* (2013.01); *H01L 21/8232* (2013.01); *H01L 27/1203* (2013.01)
USPC .................... 365/177; 365/210.12; 365/225.6

(58) Field of Classification Search
USPC .................. 365/177, 225.6, 210.12
See application file for complete search history.

(56) References Cited

U.S. PATENT DOCUMENTS

| | | | |
|---|---|---|---|
| 3,197,710 A | 7/1965 | Lin | 330/307 |
| 4,999,518 A | 3/1991 | Dhong et al. | 326/109 |
| 5,289,409 A * | 2/1994 | Reinschmidt | 365/154 |
| 5,298,786 A | 3/1994 | Shahidi et al. | 257/559 |
| 5,583,059 A | 12/1996 | Burghartz | 438/319 |
| 6,340,612 B1 | 1/2002 | Noble et al. | 438/213 |
| 6,434,041 B2 * | 8/2002 | Forbes | 365/177 |
| 6,812,545 B2 | 11/2004 | Dunn et al. | 257/565 |
| 7,088,607 B2 * | 8/2006 | Matsuzawa et al. | 365/153 |
| 8,526,220 B2 * | 9/2013 | Cai et al. | 365/156 |
| 2013/0322159 A1 * | 12/2013 | Pelley et al. | 365/154 |

OTHER PUBLICATIONS

U.S. Appl. No. 13/691,823, filed Dec. 2012, Jin et al.*
U.S. Appl. No. 12/958,647, filed Dec. 2, 2010 (not yet published).

(Continued)

*Primary Examiner* — Pho M Luu
(74) *Attorney, Agent, or Firm* — Ido Tuchman; Louis J. Percello

(57) ABSTRACT

A memory array that includes a SOI substrate and lateral bipolar junction transistors (BJTs) fabricated on the SOI substrate. The BJTs form first and second inverters cross coupled to form a memory cell. A read circuit outputs the binary state of the memory cell. A power supply is configured to supply a Vdd voltage to the read circuit and to supply a Vcc and a Vee voltage to the first set of lateral bipolar transistors and the second set of lateral bipolar transistors, wherein the Vee voltage is at least zero volts and the Vcc voltage is greater than the Vee voltage and is equal to or less than the Vdd voltage.

6 Claims, 4 Drawing Sheets

(56) References Cited

OTHER PUBLICATIONS

T. C. Chen et al., "Lateral Bipolar Transistor With Elevated Base Contact.," IBM Tech. Discl. Bull., Nov. 1989, pp. 157-159.

S. Parke et al., "A Versatile, SOI BiCMOS Technology with Complementary Lateral BJT's," IEDM, 1992, pp. 453-456.

M. Rodder, et al., "Silicon-on-Insulator Bipolar Transistors," IEEE Electron Device Letters, vol. EDL-4, No. 6, 1983, pp. 193-195.

J. C. Sturm, et al., "A Lateral Silicon-on-Insulator Bipolar Transistor with a Self-Aligned Base Contact," IEEE Electron Device Letters, vol. EDL-8, No. 3, 1987, pp. 104-106.

* cited by examiner

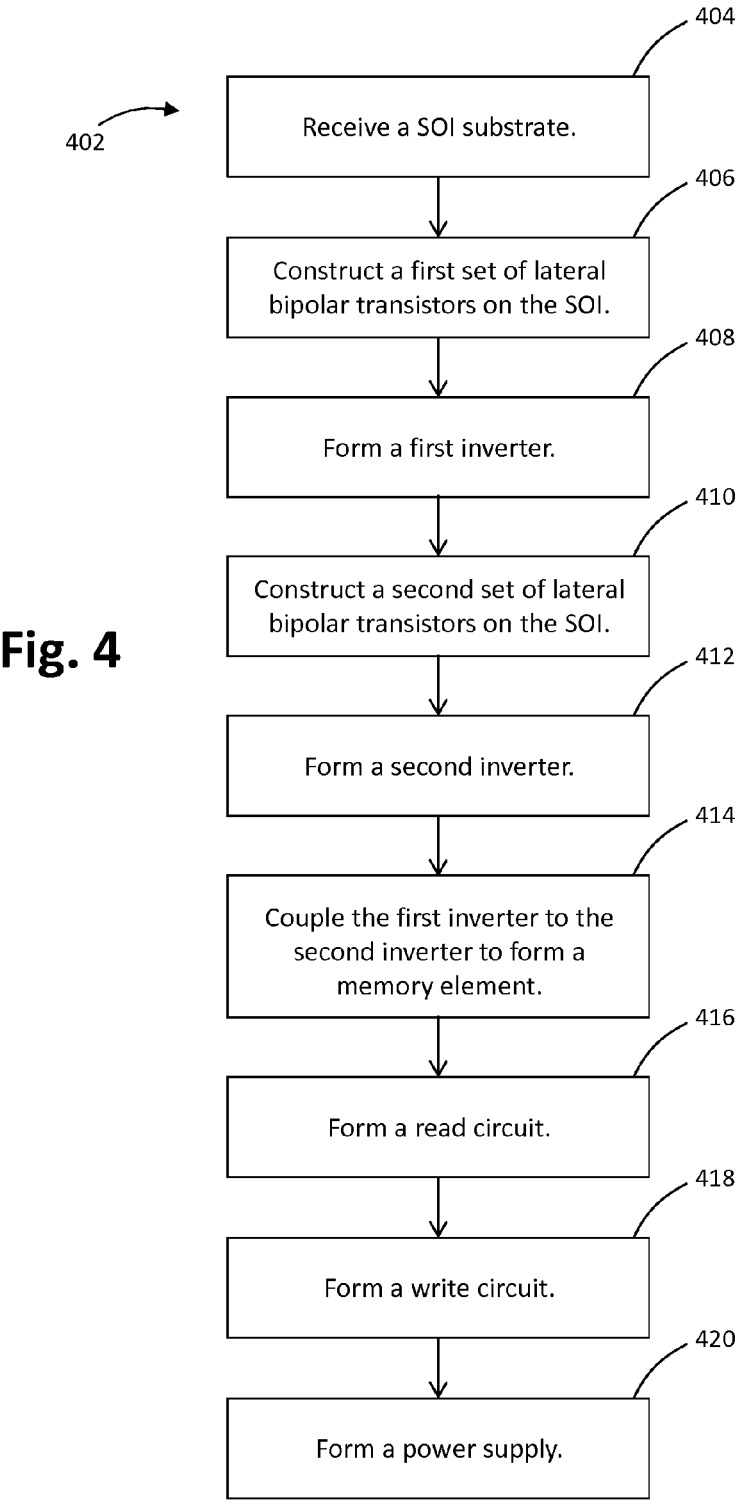

COMPLEMENTARY SOI LATERAL BIPOLAR FOR SRAM IN A CMOS PLATFORM

CROSS-REFERENCE TO RELATED APPLICATIONS

This application claims priority under 35 U.S.C. §120 to U.S. patent application Ser. No. 13/691,823 filed Dec. 2, 2012, the entire text of which is specifically incorporated by reference herein.

BACKGROUND

The present invention is directed toward semiconductor circuits, and more particularly to complementary semiconductor-on-insulator lateral bipolar SRAM circuits and methods for fabrication such circuits.

Digital logic has been dominated by silicon complementary metal-oxide-semiconductor (CMOS) circuits. However, it is becoming increasingly difficult to fabricate CMOS circuitry that meets technology's demand for ever smaller devices that operate using less power. For example, the performance of static random access memory (SRAM) implemented in CMOS is reaching a limit due to its poor signal-to-noise margins at low operating voltages (i.e., less than 0.5 V).

Using bipolar transistors to construct SRAM cells offers lower standby power and large static noise margin. However, conventional vertical bipolar transistors are generally not suitable for high density digital logic because of their large footprint due to isolation structure, and their large parasitic capacitance due to minority carrier charge storage.

SUMMARY

One example of the invention is a memory array with a semiconductor-on-insulator (SOI) substrate. A first set of lateral bipolar junction transistors (BJTs) is fabricated on the SOI substrate. The first set of lateral BJTs form a first inverter having a first output terminal configured to invert a first input signal at a first input terminal. A second set of lateral BJTs is also fabricated on the SOI substrate. The second set of lateral BJTs form a second inverter having a second output terminal configured to invert a second input signal at a second input terminal. The second inverter is cross coupled to the first inverter such that the first input terminal is electrically coupled to the second output terminal and the second input terminal is electrically coupled to the first output terminal.

A read circuit is configured to output the binary state of the second output terminal. The read circuit includes a high impedance read input electrically coupled to the second output terminal, a read enable input electrically coupled to a read word line, and a read output electrically coupled to a read bit line. A power supply is configured to supply a Vdd voltage to the read circuit and to supply a Vcc and a Vee voltage to the first set of lateral bipolar transistors and the second set of lateral bipolar transistors. The Vee voltage is at least zero volts and the Vcc voltage is greater than the Vee voltage and is equal to or less than the Vdd voltage.

Another example of the invention is a method for fabricating a memory cell. The method includes receiving a semiconductor-on-insulator (SOI) substrate. A constructing step constructs a first set of lateral bipolar transistors on the SOI substrate. A coupling step couples the first set of lateral bipolar transistors to form a first inverter having a first output terminal configured to invert a first input signal at a first input terminal. A constructing step constructs a second set of lateral bipolar transistors on the SOI substrate. Another coupling step couples the second set of lateral bipolar transistors to form a second inverter having a second output terminal configured to invert a second input signal at a second input terminal. A cross coupling step cross couples the first inverter to the second inverter such that the first input terminal is electrically coupled to the second output terminal and the second input terminal is electrically coupled to the first output terminal. A constructing step constructs a read circuit configured to output the binary state of the second output terminal. The read circuit includes a high impedance read input electrically coupled to the second output terminal, a read enable input electrically coupled to a read word line, a read output electrically coupled to a read bit line. A further constructing step constructs a power supply configured to supply a Vdd voltage to the read circuit and to supply a Vcc and a Vee voltage to the first set of lateral bipolar transistors and the second set of lateral bipolar transistors. The Vee voltage is at least zero volts and the Vcc voltage is greater than the Vee voltage and is equal to or less than the Vdd voltage.

BRIEF DESCRIPTION OF THE DRAWINGS

FIG. 4 shows a flowchart representing an example method for fabricating memory cell contemplated by the present invention.

DETAILED DESCRIPTION

Figure 1:
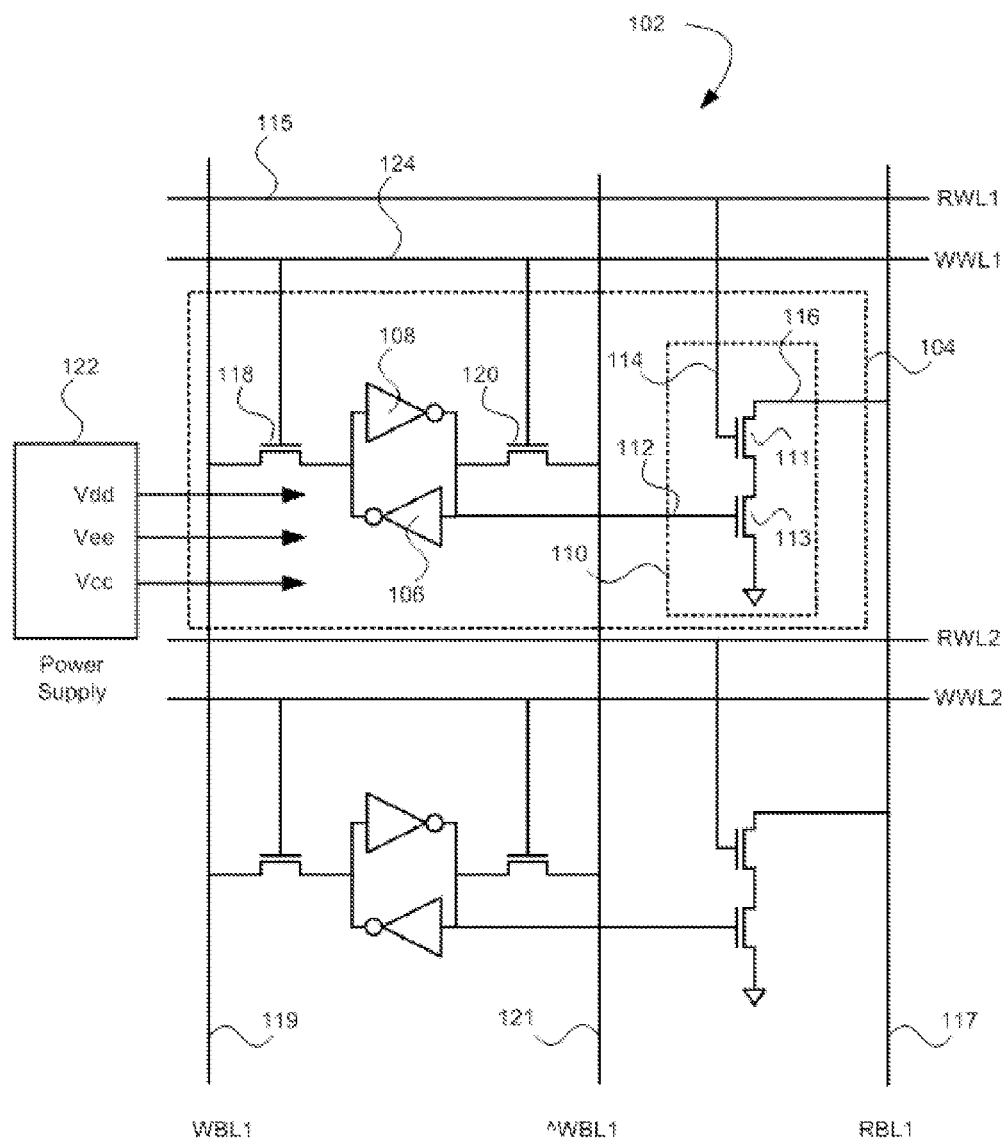
FIG. 1 shows an example embodiment of a memory array contemplated by the present invention.

The present invention is described with reference to embodiments of the invention. Throughout the description of the invention reference is made to FIGS. 1-4. When referring to the figures, like structures and elements shown throughout are indicated with like reference numerals.

FIG. 1 shows an example embodiment of a memory array 102 contemplated by the present invention. The memory array includes a memory cell 104 fabricated on a semiconductor-on-insulator (SOI) substrate. The memory cell 104 includes a first inverter 106 and a second inverter 108 formed from lateral bipolar junction transistors (BJTs). The inverters are configured to invert an input signal at their input terminal. For example, the inverter outputs a logic "0" signal at its output terminal if a logic "1" signal is presented at the input terminal. Furthermore, the inverter outputs a logic "1" signal at its output terminal if a logic "0" signal is presented at the input terminal.

The second inverter 108 is cross coupled to the first inverter 106 such that the input terminal of the first inverter 106 is electrically coupled to the output terminal of the second inverter 108 and the input terminal of the second inverter 108 is electrically coupled to the output terminal of the first inverter 106. In this arrangement, the cross-coupled inverters act as memory elements. Each memory element can store a logic state. For example, a memory element may store a logic state in which the first inverter outputs a logic "1", and another memory element may store a logic state in which the first inverter outputs a logic "0".

The memory array 102 includes a read circuit 110 configured to output the binary state of the second inverter 108. The read circuit 110 includes a high impedance read input 112 electrically coupled to the output of the second inverter 108. In one embodiment, the high impedance read input 112 is at least one mega ohms. The read circuit 110 also includes a read enable input 114 electrically coupled to a read word line (RWL1) 115. The read circuit 110 also includes a read output 116 electrically coupled to a read bit line (RBL1) 117.

In one embodiment of the invention, the read circuit 110 includes a first read field effect transistor (FET) 111 and a second read FET 113 electrically coupled in series circuit. The high impedance read input 112 is a gate terminal of the first read FET. The read enable input 114 is a gate terminal of the second read FET. The read output 116 is a source terminal of the second read FET. It is contemplated that the first and second read FETs can be n-channel FETs or p-channel FETs.

The memory array 102 may include a write circuit electrically coupled to a write word line (WWL1) 124. The write circuit is configured to change the state of the binary states of the first inverter 106 and the second inverter 108. As shown, the write word line (WWL1) 124 is separate from the read word line (RWL1) 115.

In one embodiment, the write circuit comprises a first access transistor 118 controlling the electrical impedance from the first inverter 106 to a write bit line true (WBL1) 119. A second access transistor 120 controls the electrical impedance from the second inverter 120 to a write bit line complement (^WBL1) 121. The first and second access transistors are configured to write data to the memory cell 104. Each of the access transistors 118 and 120 includes a gate terminal coupled to a word write line (WWL1) 124. It is contemplated that the first and second access transistors 118 and 120 are FETs, which can be n-channel FETs or p-channel FETs.

The BJT inverters are stable with lower current than CMOS counterpart at a supply voltage Vcc at approximately 1V and below. The BJT current can be exponentially modulated by the supply voltage. In one embodiment, the BJT turn on voltage is approximately 0.9V for silicon base, approximately 0.7V for SiGe base (30% Ge), and approximately 0.5V for Ge base, mostly determined by material (band gap), less sensitive to doping level in the base.

The memory array 102 also includes a power supply 122. The power supply is configured to supply a Vdd voltage to the read circuit 110 and to supply a Vcc and a Vee voltage to the first and second inverters 106 and 108. Furthermore, the Vee voltage is at least zero volts and the Vcc voltage is greater than the Vee voltage and is equal to or less than the Vdd voltage. In one embodiment of the invention, the Vcc voltage is at least five times greater than the Vee voltage.

To write or program a memory cell 104 in the memory array 102, the write bit line 119 and write bit line complement 121 lines for the column containing the memory cell 104 are set to a desired logic value to be stored. The write word line 124 corresponding to the memory cell 104 is then set so that the access transistors 118 and 120 are activated. This forces the memory cell 104 to overwrite its current logic value with the new logic value present on the write bit line 119 and write bit line complement 121 lines.

To read a memory cell 104 in the memory array 102, the read word line 115 corresponding to the memory cell 104 is set so that the access transistors 111 and 113 are activated. Sense amplifiers coupled to the memory cell's RBL 117 are then used to detect the logic value stored in the memory cell 104.

The bistable memory element 104 consisting of two cross-coupled complementary SOI lateral bipolar inverters advantageously has significantly better noise margin than a CMOS counterpart. Thus, when operated at low voltages, such as 0.5 Volts or lower, the bipolar memory element has much smaller standby power dissipation than the CMOS counterpart. Furthermore, smaller access transistors 118 and 120 are required to program the memory element 104 to the desired state.

Figure 2:
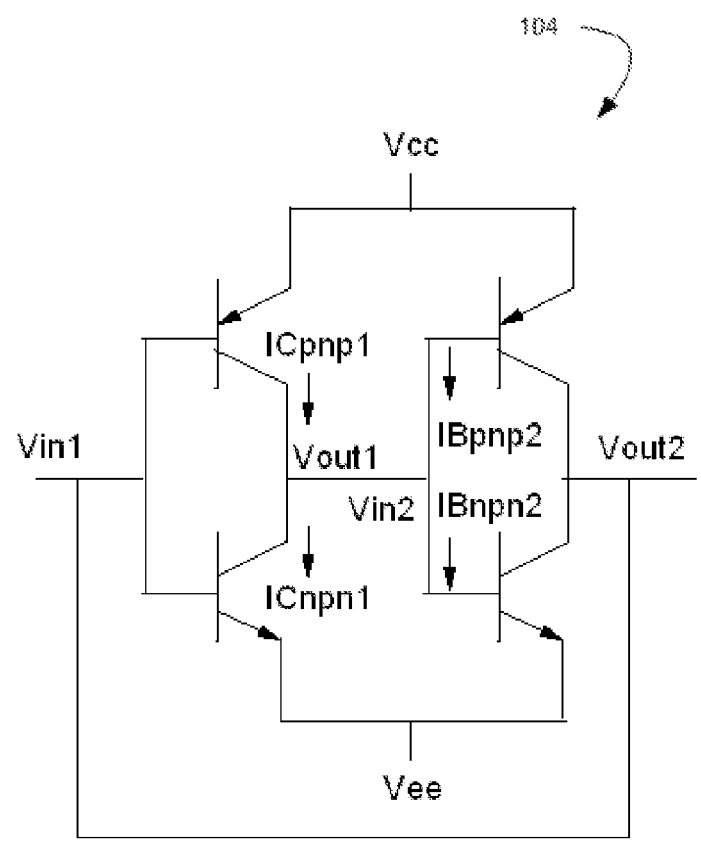
FIG. 2 shows an example embodiment of a memory element in a memory cell contemplated by the present invention.

Turning to FIG. 2, the cross-coupled inverters of the memory cell 104 are made with lateral bipolar devices. Specifically, the first inverter is formed by a first set of lateral BJTs fabricated on the SOI substrate. The second inverter is formed by a second set of lateral BJTs fabricated on the SOI substrate. As discussed above, the first inverter is cross coupled to the second inverter such that the first input terminal is electrically coupled to the second output terminal and the second input terminal is electrically coupled to the first output terminal.

In one embodiment of the invention, the first set of lateral BJTs and the second set of lateral BJTs each includes a lateral PNP BJT and a lateral NPN BJT fabricated on the SOI substrate. The lateral PNP BJT includes a PNP base, a PNP emitter, and a PNP collector. The lateral NPN BJT includes a NPN base, a NPN emitter, and a NPN collector.

Figure 3:
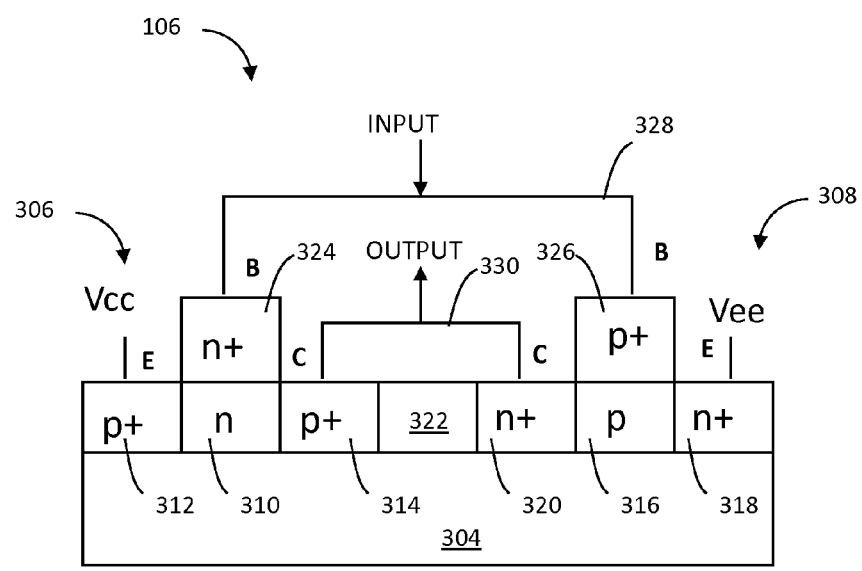
FIG. 3 shows an example embodiment of a complementary lateral bipolar junction transistor inverter circuit contemplated by the present invention.

FIG. 3 shows an example embodiment of a complementary bipolar junction transistor inverter circuit 106 contemplated by the present invention. The inverter circuit 106 includes a SOI substrate 304. In a particular embodiment, the SOI wafer used has a silicon thickness between 10 nm to 100 nm, and a buried insulator thickness between 20 nm to 200 nm. The inverter circuit 106 further includes a lateral PNP bipolar transistor 306 and a lateral NPN bipolar transistor 308 fabricated on the SOI substrate 304. The lateral PNP bipolar transistor 306 and the NPN bipolar transistor 308 may be separated by a shallow insulation trench 322 made from dielectric material.

The lateral PNP bipolar transistor 306 includes a PNP base 310 between a PNP emitter 312 and a PNP collector 314. The PNP base 310 is an n-type semiconductor region and the PNP emitter 312 and the PNP collector 314 are heavily-doped p-type semiconductor regions separated by the PNP base 310. As used herein, heavy doping means introducing more than one dopant atom per one-hundred thousand atoms of silicon. The lateral PNP bipolar transistor 306 also includes a PNP extrinsic base region 324 abutting the PNP base 310. The PNP extrinsic base region 324 is a heavily-doped n-type semiconductor region. Furthermore, the PNP base, the PNP emitter, and the PNP collector abut the buried insulator of the SOI substrate.

The lateral NPN bipolar transistor 308 includes a NPN base 316 between a NPN emitter 318 and a NPN collector 320. The NPN base 316 is a p-type semiconductor region and the NPN emitter 318 and the NPN collector 320 are heavily-doped n-type semiconductor regions separated by the NPN base 316. The lateral NPN bipolar transistor 308 also includes a NPN extrinsic base region 326 abutting the NPN base 316. The NPN extrinsic base region 326 is a heavily-doped p-type semiconductor region. Furthermore, the NPN base 316, the NPN emitter 318, and the NPN collector 320 abut the buried insulator of the SOI substrate.

The inverter circuit 106 includes an input terminal 328 electrically coupled to the NPN extrinsic base region 326 and the PNP extrinsic base region 324. Additionally, an output terminal 330 is electrically coupled to the NPN collector 320 and the PNP collector 314. The inverter circuit 106 is powered with a power voltage line Vcc electrically coupled to the PNP emitter 312 and a voltage line Vee electrically coupled to the NPN emitter 318. The PNP base 310 and the NPN base 316 may be fabricated from silicon or silicon-germanium alloy.

For a detailed discussion of the steps for fabricating a complementary transistor inverter circuit, the reader is referred to U.S. patent application Ser. No. 13/158,420 filed Jun. 12, 2011, titled "COMPLEMENTARY SOI LATERAL BIPOLAR FOR SRAM IN A LOW-VOLTAGE CMOS PLATFORM" and incorporated herein in its entirety by reference.

FIG. 4 illustrates a process 402 for fabricating a memory array in accordance with one embodiment of the present invention. It should be noted that in some alternative implementations, the operations noted in a flowchart block may occur out of the order noted in the figures. For example, two blocks shown in succession may, in fact, be executed substantially concurrently, or the blocks may sometimes be performed in the reverse order, depending upon design requirements. The method includes a receiving step 404, providing a silicon-on-insulator (SOI) wafer as a starting substrate.

Next, at constructing operation 406, a first set of lateral bipolar transistors are constructed on the SOI substrate. At coupling operation 408, the first set of lateral bipolar transistors are coupled to form a first inverter having a first output terminal configured to invert a first input signal at a first input terminal.

At constructing operation 410, a second set of lateral bipolar transistors are constructed on the SOI substrate. At coupling operation 412, the second set of lateral bipolar transistors are coupled to form a second inverter having a second output terminal configured to invert a second input signal at a second input terminal.

At cross coupling step 414, the first inverter is cross coupled to the second inverter such that the first input terminal is electrically coupled to the second output terminal and the second input terminal is electrically coupled to the first output terminal. This operation forms a memory element, as discussed above.

At constructing operation 416, a read circuit is constructed configured to output the binary state of the second output terminal. The read circuit includes a high impedance read input electrically coupled to the second output terminal, a read enable input electrically coupled to a read word line, and a read output electrically coupled to a read bit line. In one embodiment, constructing the read circuit further includes fabricating a first read FET and a second read FET electrically coupled in series circuit. For example, the high impedance read input is a gate terminal of the first read FET, the read enable input is a gate terminal of the second read FET, and the read output is a source terminal of the second read FET. It is contemplated that the first and second read FETs can be n-channel FETs or p-channel FETs.

At constructing operation 418, a write circuit is fabricated that electrically coupled to a write word line and configured to change the state of the binary states of the first and second inverters in the memory cell. The write word line is separate from the read word line. In one embodiment, the write circuit includes a first and second access transistor. The first access transistor controls the electrical impedance from the first inverter to a write bit line true (WBL). The second access transistor controls the electrical impedance from the second inverter to a write bit line complement (^WBL).

At constructing operation 420, a power supply is fabricated that supplies a Vdd voltage to the read circuit and a Vcc voltage and a Vee voltage to the first and second set of lateral bipolar transistors. The Vee voltage is at least zero volts and the Vcc voltage is greater than the Vee voltage.

Having described embodiments for the invention (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a memory array, the method comprising:
  receiving a semiconductor-on-insulator (SOI) substrate;
  constructing a first set of lateral bipolar transistors on the SOI substrate;
  coupling the first set of lateral bipolar transistors to form a first inverter having a first output terminal configured to invert a first input signal at a first input terminal;
  constructing a second set of lateral bipolar transistors on the SOI substrate;
  coupling the second set of lateral bipolar transistors to form a second inverter having a second output terminal configured to invert a second input signal at a second input terminal; and
  cross coupling the first inverter to the second inverter such that the first input terminal is electrically coupled to the second output terminal and the second input terminal is electrically coupled to the first output terminal
  constructing a read circuit configured to output the binary state of the second output terminal, the read circuit including (a) a high impedance read input electrically coupled to the second output terminal, (b) a read enable input electrically coupled to a read word line, and (c) a read output electrically coupled to a read bit line; and
  constructing a power supply configured to supply a Vdd voltage to the read circuit and to supply a Vcc and a Vee voltage to the first set of lateral bipolar transistors and the second set of lateral bipolar transistors, wherein the Vee voltage is at least zero volts and the Vcc voltage is greater than the Vee voltage and is equal to or less than the Vdd voltage.

2. The method of claim 1, wherein constructing the read circuit further comprises:
  fabricating a first read field effect transistor (FET) and a second read FET electrically coupled in series circuit;
  wherein the high impedance read input is a gate terminal of the first read FET;
  wherein the read enable input is a gate terminal of the second read FET; and
  wherein the read output is a source terminal of the second read FET.

3. The method of claim 2, wherein the first and second read FETs are n-channel FETs.

4. The method of claim 2, wherein the first and second read FETs are p-channel FETs.

5. The method of claim 1, further comprising fabricating a write circuit electrically coupled to a write word line and configured to change the state of the binary states of the first inverter and the second inverter, the write word line being separate from the read word line.

6. The method of claim 5, wherein the write circuit comprises:
  a first access transistor controlling electrical impedance from the first inverter to a write bit line true (WBL); and
  a second access transistor controlling electrical impedance from the second inverter to a write bit line complement (^WBL).

* * * * *